United States Patent
Büchel et al.

(10) Patent No.: US 8,207,055 B2
(45) Date of Patent: Jun. 26, 2012

(54) METHOD FOR GENERATING AN ELECTRODE LAYER PATTERN IN AN ORGANIC FUNCTIONAL DEVICE

(75) Inventors: Michael Büchel, Eindhoven (NL); Ivar Jacco Boerefijn, Eindhoven (NL); Edward Willem Albert Young, Eindhoven (NL); Adrianus Sempel, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 521 days.

(21) Appl. No.: 11/993,472

(22) PCT Filed: Jun. 27, 2006

(86) PCT No.: PCT/IB2006/052113
§ 371 (c)(1),
(2), (4) Date: May 10, 2010

(87) PCT Pub. No.: WO2007/004121
PCT Pub. Date: Jan. 11, 2007

(65) Prior Publication Data
US 2010/0221853 A1 Sep. 2, 2010

(30) Foreign Application Priority Data
Jun. 30, 2005 (EP) .................................. 05105867

(51) Int. Cl.
*H01L 21/44* (2006.01)

(52) U.S. Cl. ......... 438/609; 257/E21.024; 257/E21.299; 257/E31.126; 257/E33.064; 438/99; 438/487; 438/597; 438/795; 438/940

(58) Field of Classification Search ........... 257/E21.024, 257/E21.299, E31.126, E33.064; 438/99, 438/487, 597, 609, 795, 940
See application file for complete search history.

(56) References Cited

U.S. PATENT DOCUMENTS
2003/0194882 A1  10/2003  Dubowski et al.
2004/0051446 A1   3/2004  Werner et al.
2005/0012094 A1   1/2005  Park

FOREIGN PATENT DOCUMENTS
JP   2002164167 A1   6/2002
WO   2004061995 A1   7/2004

*Primary Examiner* — Asok Sarkar
(74) *Attorney, Agent, or Firm* — John F. Salazar; Mark L. Beloborodov

(57) ABSTRACT

A method for generating an electrode layer pattern in an organic functional device (101; 201) comprising a first transparent electrode layer (103; 203), a second electrode layer (104; 204) and an organic functional layer (102; 202) sandwiched between said first and second electrode layers (103, 104; 203, 204). The method comprises the steps of arranging (601) a laser (704; 804) to irradiate said organic functional device (701; 801) through said first transparent electrode layer (103; 203), selecting (602) a set of laser parameters in order to enable said laser (704; 804) to locally modify an electric conductivity of said second electrode layer (104; 204), and locally modifying, by said laser (704; 804) in accordance with said set of laser parameters, the electric conductivity of said second electrode layer (104; 204), thereby generating said electrode layer pattern.

6 Claims, 6 Drawing Sheets

METHOD FOR GENERATING AN ELECTRODE LAYER PATTERN IN AN ORGANIC FUNCTIONAL DEVICE

The present invention relates to a method for generating an electrode layer pattern in an organic functional device comprising a first transparent electrode layer, a second electrode layer and an organic functional layer sandwiched between the first and second electrode layers, the first electrode layer being provided on a substrate.

Common for all organic functional devices, such as organic light emitting diodes (OLEDs), organic solar cells, organic photovoltaic elements, organic photo diodes, organic photosensors etc., is that at least one organic layer is sandwiched between and interacts with a pair of electrode layers. In an OLED, the application of a voltage between the electrode layers results in emission of light by the organic layer and in an organic solar cell, absorption of light by the organic layer leads to the creation of a voltage between the electrode layers.

The electrode layers of an organic functional device are usually patterned in order to, for example, increase the functionality of an organic light emitting panel. Patterning of the electrode layers may also increase the overall yield of large area organic functional devices such as organic solar cells, since a distribution of defects across a device having patterned electrode layers disables a lower proportion of the device than if the electrode layers were unpatterned.

Electrode layers of an organic functional device may be patterned using various techniques such as photolithography, vapor-deposition or laser processing. Compared to the other known techniques, laser processing provides more degrees of freedom in the patterning. For example, the laser can be controlled via software, the patterning becomes very flexible and changes are possible to implement almost instantly.

In US 2004/0051446, a method for structuring electrodes in an organic light emitting display through laser ablation is disclosed. Here, a metal electrode layer is ablated using an expanded laser beam in order to form periodic electrode structures. The ablated material is absorbed by an exhaust unit in order not to contaminate the organic light emitting display.

Using this method, it would appear that very careful handling of the display be needed while the electrode structuring or patterning is carried out as well as during loading and un-loading of the apparatus carrying out the structuring. It is well known that a sensitive process, such as the method disclosed in US 2004/00501446, is prone to generate more errors and be more costly than a robust process.

There is thus a need for a more robust and less costly method for patterning of electrode layers in an organic functional device.

In view of the above-mentioned and other drawbacks of the prior art, a general object of the present invention is to provide an improved method for patterning of an electrode layer in an organic functional device.

A further object of the present invention is to enable relatively robust patterning of an electrode layer in an organic functional device.

An additional object of the present invention is to provide a less costly method for patterning of an electrode layer in an organic functional device.

According to the present invention, these and other objects are achieved through a method, for generating an electrode layer pattern in an organic functional device comprising a first transparent electrode layer, a second electrode layer and an organic functional layer sandwiched between the first and second electrode layer, comprising the steps of arranging a laser to irradiate the organic functional device through the first transparent electrode layer, selecting a set of laser parameters in order to enable the laser to locally modify the electric conductivity of the second electrode layer, and locally modifying, by the laser in accordance with the set of laser parameters, the electric conductivity of the second electrode layer, thereby generating the electrode layer pattern.

Examples of organic functional devices include organic light-emitting diodes (OLEDs), organic photocells, organic photovoltaic elements, organic photodiodes and organic photosensors.

By the term "electrode layer" should be understood an electrically conductive layer which could be transparent or non-transparent to light.

The transparent electrode layer may, for example, be manufactured of any material, which is inherently conductive and transparent or, alternatively, of a sufficiently thin metal layer, which could be provided in combination with a transparent conductive or non-conductive layer.

The "organic functional layer" may consist of many different organic layers with different functions (such as hole injection, hole transport, hole blocking, excitation blocking, electron blocking, electron transport, electron injection or light emitting, light absorbing layers), or mixtures thereof, but may also include metal-organic materials like triplet emitters or inorganic materials such as dielectric, semi-conducting or metallic quantum dots or nano-particles.

The laser irradiation may be continuous or, preferably, pulsed and the laser used may be any laser capable of being tuned to suitable settings for performing the electrical isolation. Such lasers may include various types of gas lasers, such as $CO_2$-lasers and Excimer lasers, or solid-state lasers, such as Nd-YAG-lasers and fibre lasers.

Through the method according to the present invention, all the sensitive processing steps involved in the production of organic functional devices may take place before a final pattern is generated in the electrode layer(s) of the device.

Thereby, the need for very careful handling during pattern generation is considerably reduced.

Futheremore the need for special processing environment, such as clean room, inert gas, vacuum or the like is practically eliminated.

It thus follows that the method according to the present invention enables a less costly and more reliable generation of patterns in an electrode layer of an organic functional device.

For example, a basic pattern may be generated in the first transparent electrode layer early in the manufacturing process and a customer-specific pattern generated in the second electrode layer as a final step in the manufacturing of the device.

The set of laser parameters may be selected so that the laser simultaneously locally modifies the electric conductivity of the first and second electrode layers.

Through this approach, a new degree of freedom is obtained for generating customer-specific patterns.

According to one embodiment, the transparent electrode layer may be provided on a transparent substrate and the laser irradiation may be applied through the substrate.

The substrate may, for example, be a thin sheet of glass or a suitable plastic, which may be rigid or flexible.

Preferably, the laser parameters may be selected so that the electric conductivity of the second electrode layer is modified through any one of ablation and melting/dewetting or a combination thereof.

These and other aspects of the present invention will now be described in more detail, with reference to the appended drawings showing a currently preferred embodiment of the invention.

FIG. 2b is a schematic plane view of the OLED in FIG. 2a.

FIG. 3b is a schematic plane view of the OLED in FIG. 3a.

Figure 1A:
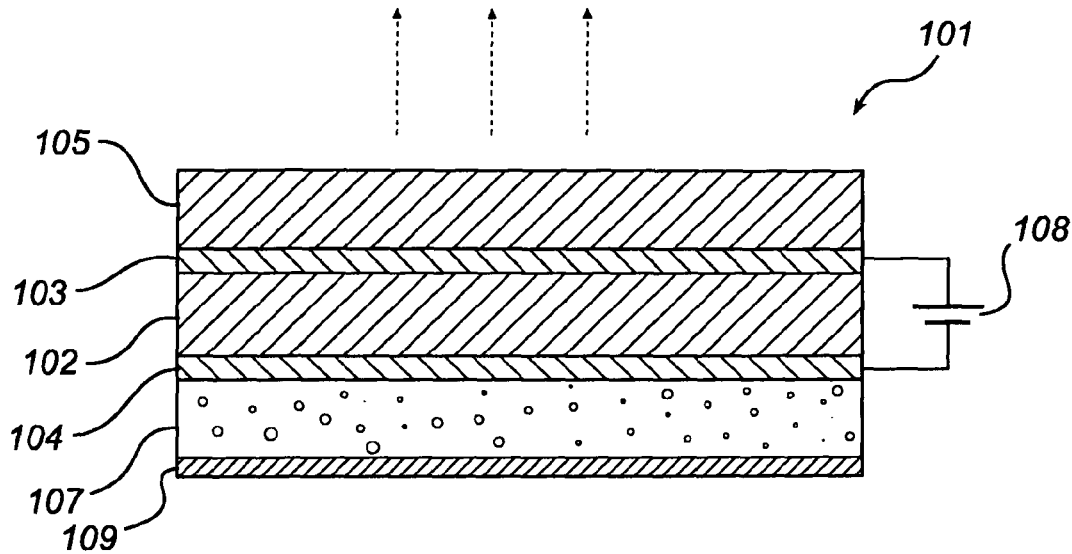
FIG. 1a is a schematic section view of a first example of an organic functional device in the form of an organic light-emitting device (OLED).
Figure 1B:
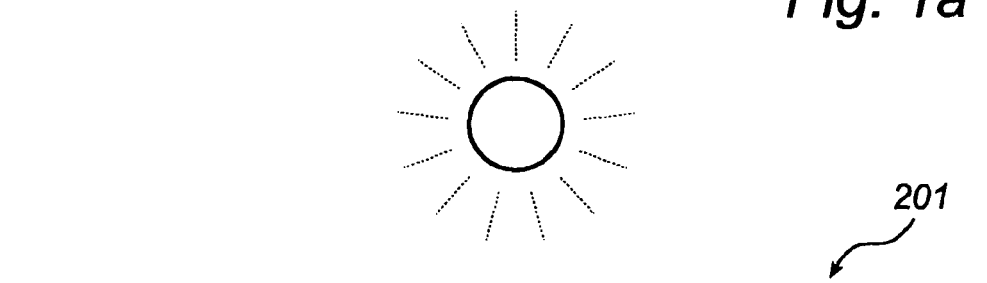
FIG. 1b is a schematic section view of a second example of an organic functional device in the form of an organic solar cell.
Figure 1B:
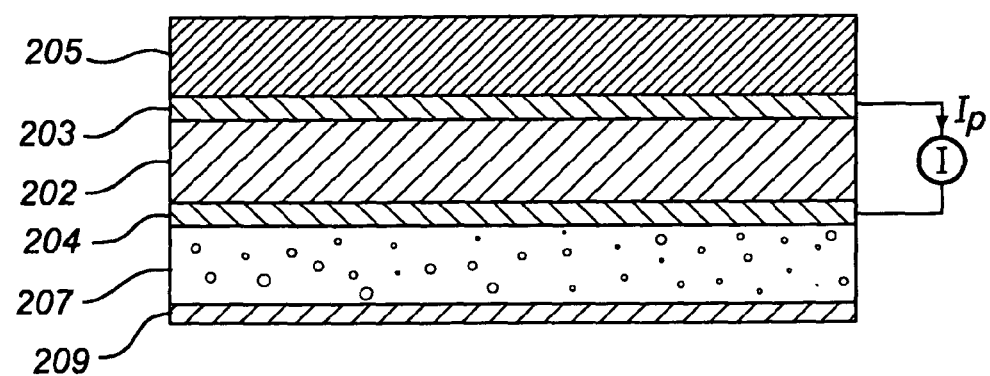

In FIG. 1, an organic functional device 101 in the form of an organic light-emitting device (OLED) is shown, where an organic functional layer 102 is sandwiched between a first transparent electrode layer 103 and a second electrode layer 104. For support and protection, the organic functional stack constituted by the organic functional layer 102 and the first and second electrode layers 103, 104 is enclosed by a substrate 105 and a protective cover 109. A cavity 107 is formed between this cover 109 and the second electrode layer 104. (Here, a portion of the device 101 is shown. The cavity 107 therefore appears open. It is, however, closed at the boundaries of the device 101.) The substrate 105 is preferably of glass or a suitable plastic material and the cover 109 may be constituted of glass, plastic or a metal. The cavity 107 is filled with a gas, typically Nitrogen gas.

The organic functional layer 102 may generally comprise several organic layers. In case the organic functional device 101 is a polymer light-emitting diode (LED), the organic functional layer 102 essentially comprises a two layer stack of a hole conductor layer and a light emitting polymer layer and may further include several additional layers such as an evaporated organic hole blocking layer on the light emitting polymer.

In case the organic functional device 101 is a small molecule OLED, the organic functional layer 102 is generally formed as a more complex stack including a hole injection layer, a hole transport layer, an electron blocking layer, a light-emitting layer, a hole blocking layer and an electron transporting layer, as well as an electron blocking layer or the like.

The first transparent electrode layer 103 is suitably formed by Indium Tin Oxide (ITO), Indium Zinc Oxide (IZO) or the like or by a thin metal layer formed on a transparent substrate. Such a metal layer should be sufficiently thin to be transparent, i.e. in the range of 5-20 nm.

The second electrode layer 104 is preferably one of Barium (Ba) or Calcium (Ca), Aluminum (Al), Silver (Ag), Zinc Selenide (which is transparent and conductive) or the like or stacks of them and may additionally contain an injection layer, such as Lithium Fluoride (LiF) or the like.

When a voltage is applied between the electrode layers (the anode and the cathode), using the voltage source 108, electrons move from the cathode layer into the OLED device. At the same time holes move from the anode layer into the OLED device.

When the positive and negative charges meet, they recombine and produce photons. The wavelength, and consequently the color, of the photons depends on the properties of the organic material in which the photons are generated. In an OLED device either the cathode layer or the anode layer or both are transparent to the photons generated, allowing the light to emit from the device to the outside world.

FIG. 1b shows an organic functional device in the form of an organic solar cell 201. The organic solar cell has a very similar build-up as the OLED shown in FIG. 1a, the main difference residing in the composition of the organic functional layer 202. In an organic solar cell 201, incoming solar radiation leads the formation of an electron-hole pair in the organic functional layer. Due to the material properties of the electrode layers 203, 204 and the organic functional layer 202, the electron is attracted to one electrode layer and the hole to the other. Thereby, a photocurrent $I_p$ is generated.

In FIGS. 2a-d an OLED-lighting device 301 with patterned electrode layers is schematically shown.

Figure 2A:
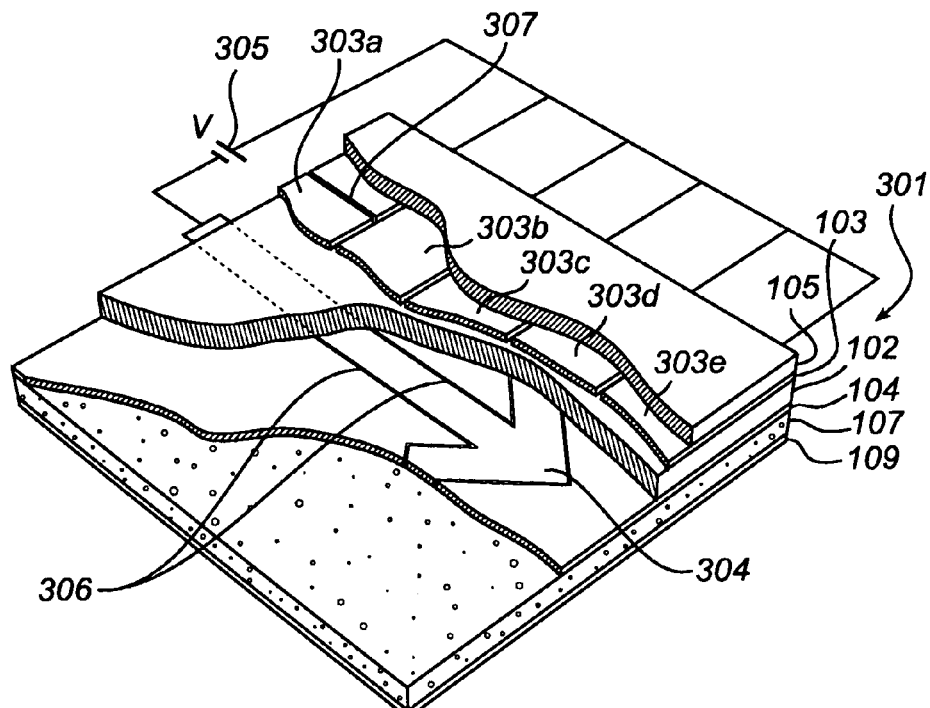
FIG. 2a is a schematic perspective view of an OLED used for lighting, in which a pattern has been generated.

FIG. 2a is a perspective view of the lighting device 301 in which layers and patterns can be seen.

Figure 2B:
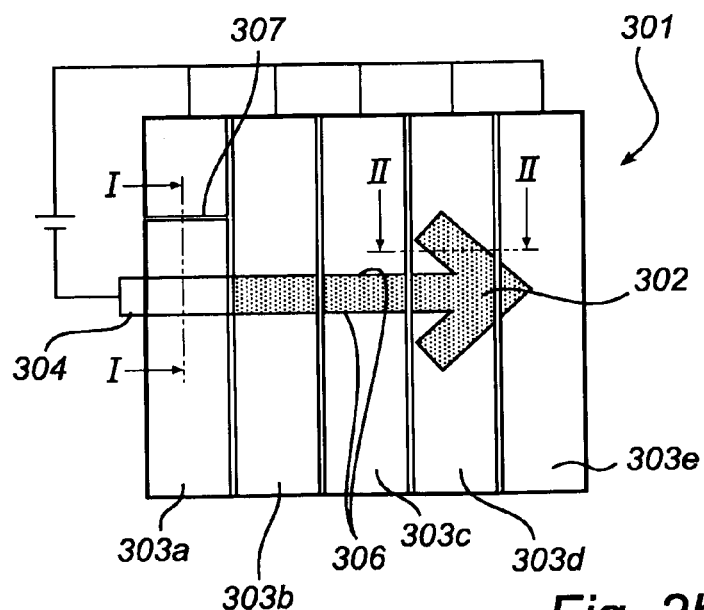

FIG. 2b is a plane view of the lighting device 301, in which a light-emitting portion 302 in the shape of an arrow is shown. The arrow 302 is made to emit light by applying a voltage V between the segments 303a-e of the first transparent electrode layer 103 and an arrow-shaped segment 304 formed in the second electrode layer 104, using a voltage source 305 connected between the electrode layers 103, 104. The arrow-shaped segment is defined by the outline 306 in the second electrode layer 104 and a further pattern has been generated along a line 307 in both of the electrode layers 103, 104.

Figure 2C:
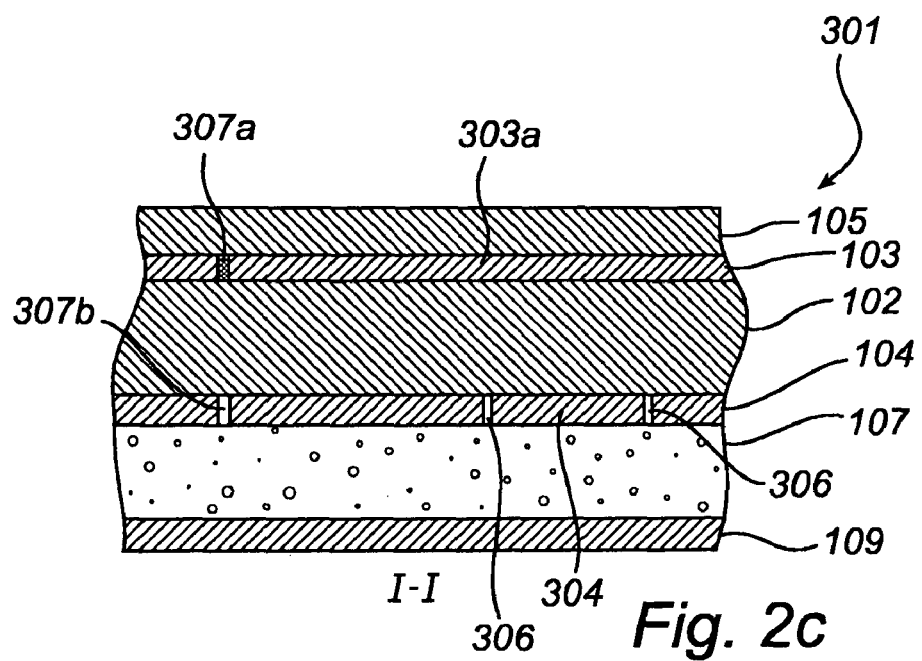
FIG. 2c is a schematic section view of the OLED in FIG. 2b along the line I-I.

FIG. 2c is a section view of the lighting device 301 in FIG. 2a along the line I-I, where a cross-section of the arrow-shaped segment 304 in the second electrode layer 104 can be seen. Along the outline 306 of the arrow 304, material has been removed from the second electrode layer 104 and along the line 307b, material has been removed from the second electrode layer 104 and the first electrode layer has been made locally highly resistive 307a.

Figure 2D:
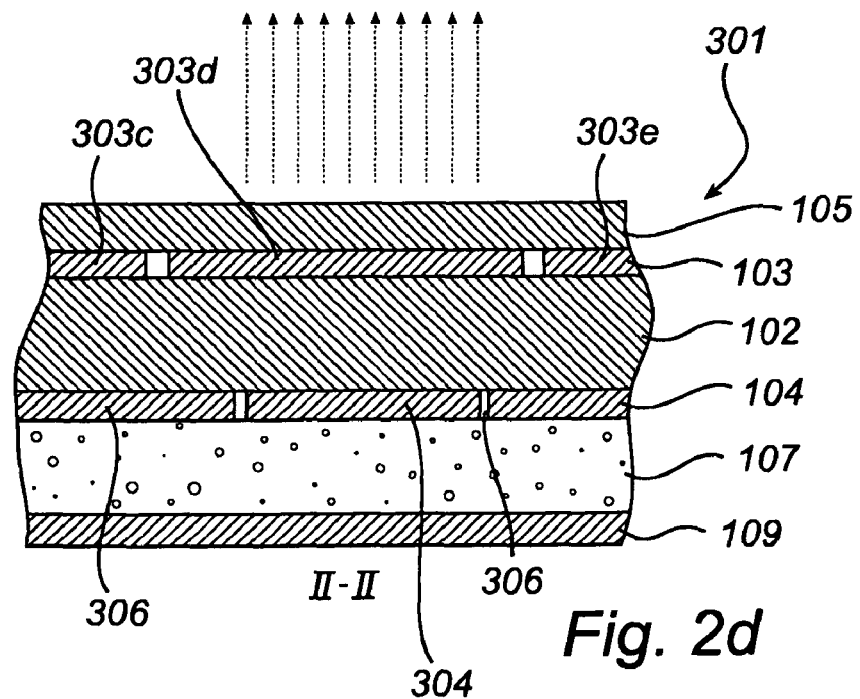
FIG. 2d is a schematic section view of the OLED in FIG. 2b along the line II-II.

FIG. 2d is a section view of the lighting device 301 in FIG. 2a along the line II-II, where a cross-section of the arrow-shaped segment 304 in the second electrode layer 104 can be seen. In the area of the lighting device 301 corresponding to this segment 304, light is emitted as indicated by the arrows in FIG. 2d.

Figure 3A:
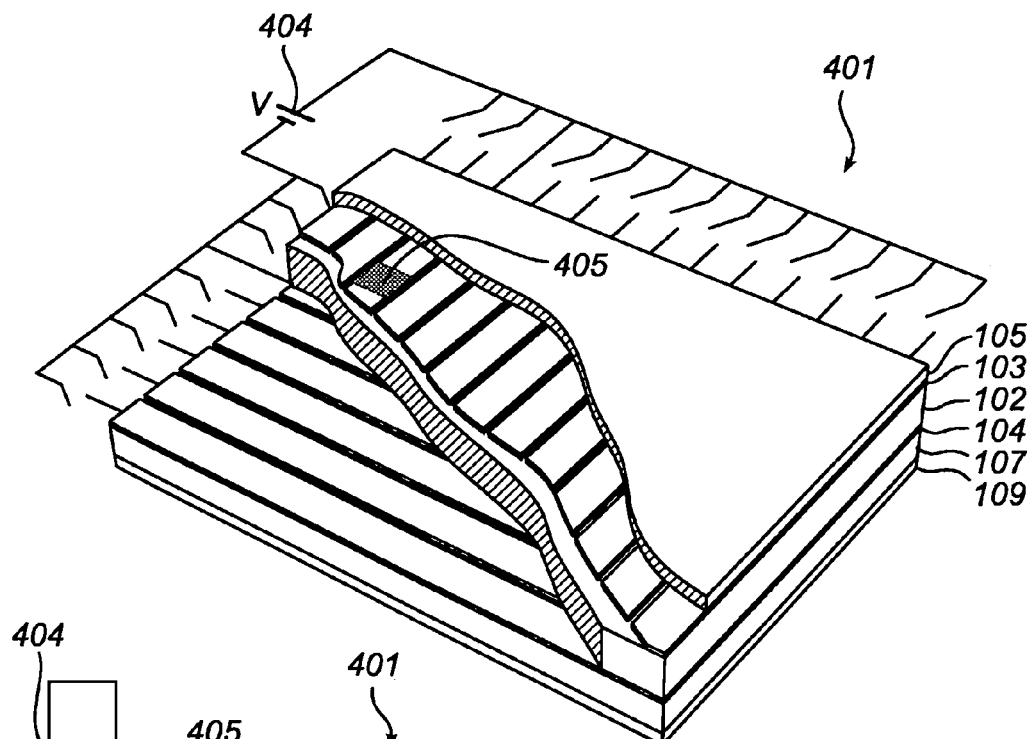
FIG. 3a is a schematic perspective view of an OLED used as a display, in which a pattern has been generated.
Figure 3B:
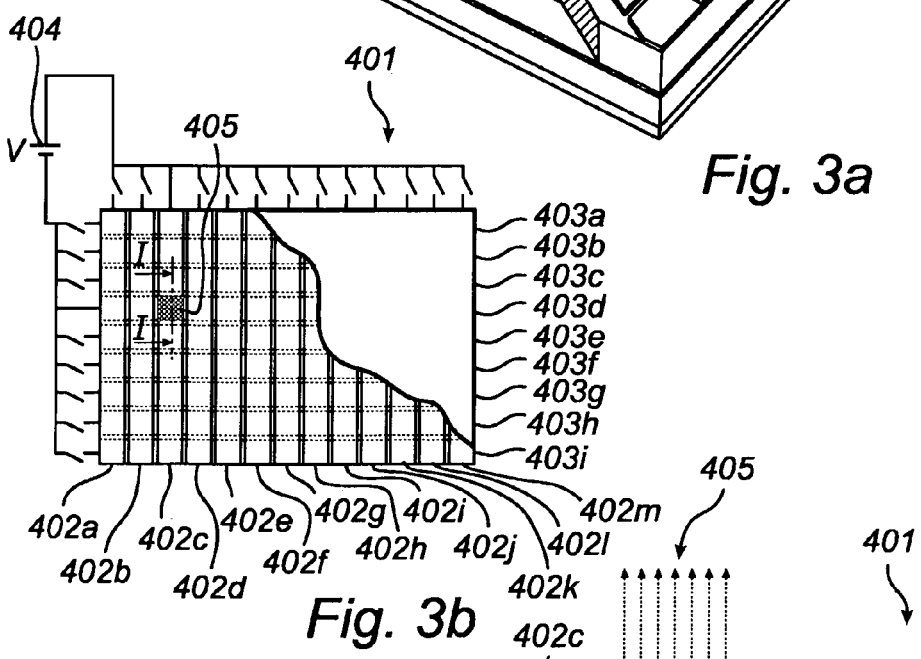
Figure 3C:
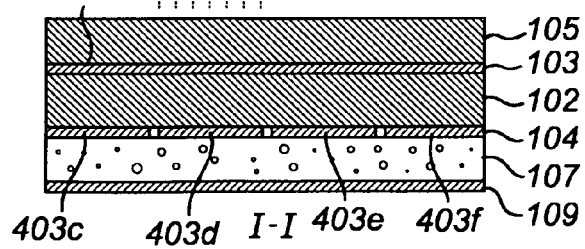
FIG. 3c is a schematic section view of the OLED in FIG. 3b along the line I-I.

In FIGS. 3a-c a part of a passive matrix OLED-display 401 (in the following called "display" for simplicity) with patterned electrode layers is schematically shown.

FIG. 3a is a perspective view of the display 401.

FIG. 3b is a plane view of the display 401 with vertically extending parallel segments 402a-m formed in the first transparent electrode layer 103 and horizontally extending parallel segments 403a-i formed in the second electrode layer 104. A voltage V is, using a voltage source 404, applied between segment 402c and 403d, whereby one pixel 405 is caused to emit light as indicated in FIGS. 3a-c.

FIG. 3c is a section view of the display 401 in FIG. 3a along the line I-I, where a cross-section of the segments 403c-f in the second electrode layer 104 can be seen. Between the segments 403a-i, material has been removed from the second electrode layer 104.

Figure 4A:
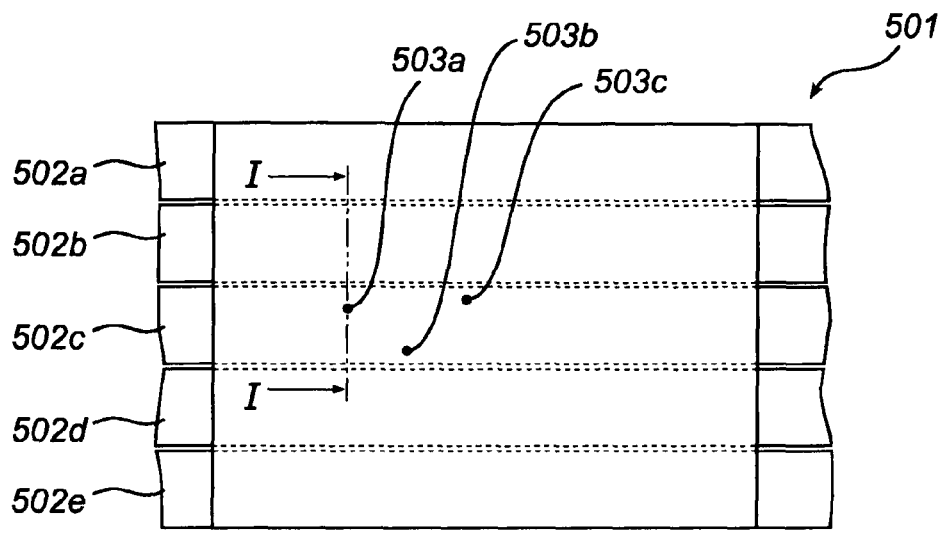
FIG. 4a is a schematic plane view of a defect-containing organic solar cell, in which a pattern has been generated.
Figure 4B:
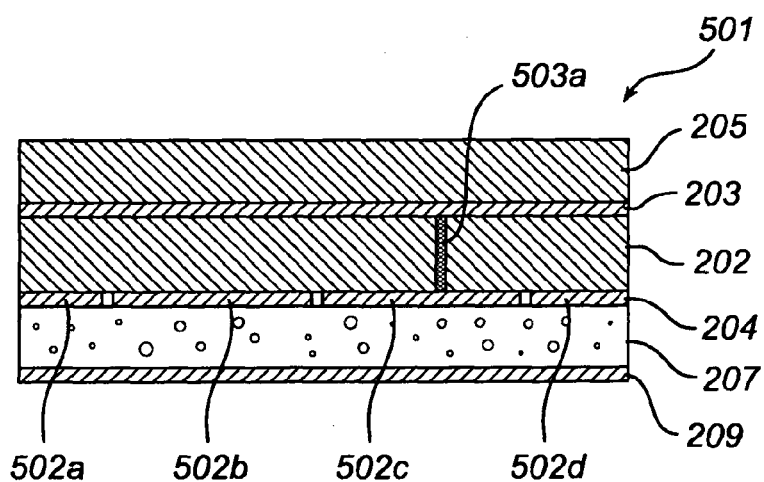
FIG. 4b is a schematic section view of the organic solar cell in FIG. 4a along the line I-I.

In FIGS. 4a-b a part of an organic solar cell 501 with patterned electrode layers is schematically shown.

FIG. 4a is a plane view of the solar cell 501 with horizontally extending parallel segments 502a-e formed in the second electrode layer 204.

FIG. 4b is a section view of the solar cell 501 in FIG. 4a along the line I-I, where a cross-section of the segments 502a-d in the second electrode layer 104 can be seen. Between the segments 503a-e, material has been removed from the second electrode layer 204.

Incoming solar radiation leads to the occurrence of a voltage between the first and second electrode layers 203, 204. By sectioning the second electrode layer 204 into segments 502a-d, the organic solar cell 501 becomes more robust, since defects, for example short-circuits 503a-c, within one segment 502c may now only lead to malfunction of an area of the solar cell 501 correponding to that segment 502c rather than of the entire solar cell 501.

Figure 5:
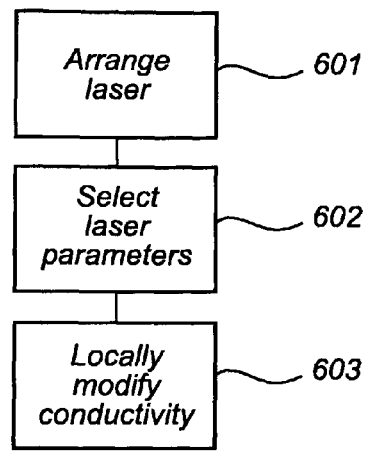
FIG. 5 is a flow chart illustrating a method according to the preferred embodiment of the invention.

FIG. 5 is a flow-chart illustrating a method according to a preferred embodiment of the present invention. In a first step 601 a laser is arranged to irradiate the organic functional device 101, 201, 301, 401, 501 through the substrate 105, 205. In a following step 602, a set of laser parameters is selected. This set of laser parameters is selected based on which electrode layer (or layers) should be patterned.

Examples of suitable laser parameters for generating a pattern in the second electrode layer 104; 204 without affecting the electric conductivity of the first electrode layer 103; 203 are:
a) Pulsed Nd-YAG laser, $\lambda=1064$ nm, pulse length: approximately 100 ns, pulse frequency 5 kHz, energy distribution: gaussian, average energy density of pulse 1.1 J/cm$^2$, number of pulses per position 5.
b) Pulsed Excimer laser, $\lambda=351$ nm, pulse length: approximately 20 ns, pulse frequency 100 Hz, energy distribution: top-hat, average energy density of pulse: 0.4 J/cm$^2$, number of pulses per position: 16.

When patterning the second electrode layer 104; 204 only, one effect of the laser irradiation is that material is ablated along the line(s) defining the pattern. Another effect of the heat development during laser treatment is that metal is melted around the laser spot and moved away due to dewetting. Generally, a pattern is generated in the second electrode layer through either of these effects or a combination thereof.

Examples of suitable laser parameters for simultaneously generating a pattern in the first and second electrode layers 103, 104; 203, 204 are:
a) Pulsed Nd-YAG laser, $\lambda=1064$ nm, pulse length: approximately 100 ns, pulse frequency 5 kHz, energy distribution: gaussian, average energy density of pulse 9 J/cm$^2$, number of pulses per position 5.
b) a) Pulsed Nd-YAG laser, $\lambda=532$ nm, pulse length: approximately 80 ns, pulse frequency 4 kHz, energy distribution: gaussian, average energy density of pulse 0.8 J/cm$^2$, number of pulses per position 3.

When simultaneously patterning both electrode layers, the conductivity of the first electrode layer 103; 203 is locally modified in addition to the above described local modification of the conductivity of the second electrode layer 104; 204. One additional effect of the laser irradiation is then that, due to local heating of the first electrode layer 103; 203, the conductivity of the first transparent electrode layer 103; 203 is locally decreased to such a degree that an electrical open is created along the line(s) defining the pattern in the first electrode layer 103; 203.

In a subsequent step 603, the electric conductivity of at least one of the electrode layers 103, 104; 203, 204 is locally modified by the laser. The electric conductivity is modified in accordance with the selected set of laser parameters and as a consequence of this selection, a pattern is generated in the second electrode layer 104; 204 or simultaneously in the first and second electrode layers 103, 104; 203, 204.

Figure 6A:
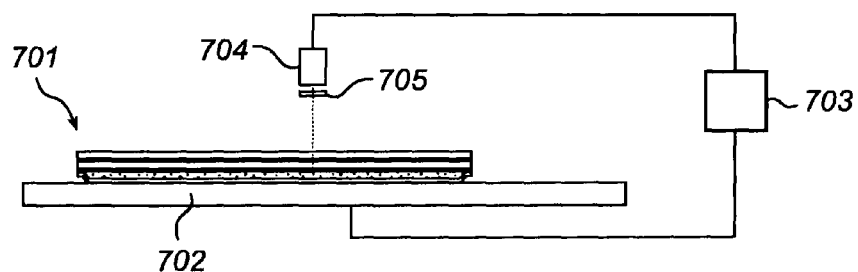
FIG. 6a is a schematic view of an arrangement for carrying out a method according to a first example of the preferred embodiment of the invention.
Figure 6B:
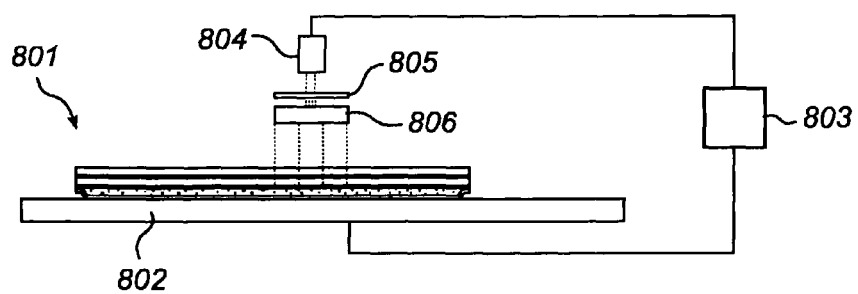
FIG. 6b is a schematic view of an arrangement for carrying out a method according to a second example of the preferred embodiment of the invention.

FIGS. 6a-b schematically show two examples of arrangements for carrying out the method according to the preferred embodiment of the present invention.

According to the first example, with reference to FIG. 6a, an organic functional device 701 is positioned on an X-Y table 702. A computer 703 controls the movement of the X-Y table 702 as well as the operation of a laser 704. The laser, in this case a solid-state laser or a gas laser, is arranged to irradiate the organic functional device 701 through an optional optical arrangement 705. Based on a desired pattern, the computer 703, through the X-Y-table, controls the position of the organic functional device 701 and the laser 704 parameters so that the desired electrode layer pattern can be generated.

According to the second example, with reference to FIG. 6b, the laser 804 is a laser capable of producing a relatively wide beam (for example an excimer laser). Between the laser 804 and the organic functional device 801 a mask 805 and a lens arrangement 806 are positioned. The mask 805 has a pattern corresponding to the pattern to be generated in the organic functional device 801. The beam modified by the mask 805 is spread out over a larger area through the lens arrangement 806. Through this arrangement, a substantial portion of the organic functional device 801 can be patterned at the same time. After patterning a first portion of the device 801, the position of the device 801 can be stepped, using the X-Y-table 802 so that the next portion can be exposed to the laser irradiation.

Laser parameters may here be selected by tuning the laser 804 so that the electric conductivity of both the first and second electrode layers 103, 104; 203, 204 can be modified simultaneously. The pattern may then be created through making the mask 805 in such a way that the laser irradiation is completely blocked where no pattern should be created, partly blocked where a pattern should be created in the second electrode layer 104; 204 only and unblocked where a pattern should be created in both electrode layers 103, 104; 203, 204 simultaneously. In other words, the pattern can be generated in the selected electrode layer(s) using one set of tuned laser parameters and a gray-scale mask 805.

The person skilled in the art realises that the present invention by no means is limited to the preferred embodiments described above. On the contrary, many modifications and variations are possible within the scope of the appended claims. For example, the laser 704; 804 can be moved and the organic functional device 701; 801 remain stationary.

The various organic functional devices described herein are all manufactured in the "traditional" way with a protective cover 109; 209 and a gas-filled cavity 107; 207. The method of the invention is equally applicable for organic functional devices of the thin-film type, in which the protective cover 109; 209 and gas-filled cavity 107; 207 are replaced by a protective layer(s) in the form of, for example, a plastic film or multiple alternating layers of $Si_xO_y$ and $Si_xN_y$. This/these protective layer(s) can be added before or, preferably, after the patterning according to the invention.

The invention claimed is:

1. A method, for generating an electrode layer pattern in an organic functional device comprising an organic functional stack including a first transparent electrode layer, a second electrode layer and an organic functional layer sandwiched between said first and second electrode layers, wherein said first transparent electrode layer is provided on a transparent substrate and said organic functional stack is enclosed by said transparent substrate and a protective cover, said method comprising the steps of:

arranging a laser to irradiate said organic functional device (701; 801) through said first transparent electrode layer;

selecting a set of laser parameters in order to enable said laser to locally modify an electric conductivity of said second electrode layer through said first transparent electrode layer and said organic functional layer, and;

locally modifying, by said laser in accordance with said set of laser parameters, the electric conductivity of said second electrode layer, thereby generating said electrode layer pattern.

2. A method according to claim 1, wherein said set of laser parameters is selected so that said laser simultaneously locally modifies said electric conductivity of said first and second electrode layers.

3. A method according to claim 1 wherein said electric conductivity of said second electrode layer is locally modified through any one of ablation and melting/dewetting or a combination thereof.

4. A method according to claim 1, wherein said laser is pulsed.

5. A method according to claim 1, wherein said organic functional device is an organic light-emitting panel.

6. A method according to claim 1, wherein said organic functional device is an organic solar cell.

* * * * *